(12) United States Patent
Noh et al.

(10) Patent No.: US 8,153,345 B2
(45) Date of Patent: Apr. 10, 2012

(54) LASER INDUCED THERMAL IMAGING APPARATUS AND LASER INDUCED THERMAL IMAGING METHOD

(75) Inventors: Sok Won Noh, Seoul (KR); Mu Hyun Kim, Yongin (KR); Seong Taek Lee, Yongin (KR); Sun Hoe Kim, Jeongeup (KR); Jin Wook Seong, Seoul (KR); Myung Won Song, Yongin (KR); Sang Bong Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 13/105,835

(22) Filed: May 11, 2011

(65) Prior Publication Data

US 2011/0212400 A1  Sep. 1, 2011

Related U.S. Application Data

(62) Division of application No. 11/512,991, filed on Aug. 28, 2006, now Pat. No. 7,960,094.

(30) Foreign Application Priority Data

Nov. 4, 2005  (KR) .................. 10-2005-0105695
Nov. 16, 2005 (KR) .................. 10-2005-0109825

(51) Int. Cl.
*G03C 8/00* (2006.01)
*G03C 1/00* (2006.01)
*G03F 7/00* (2006.01)

(52) U.S. Cl. ............... 430/200; 430/253; 430/270.1; 430/311

(58) Field of Classification Search .................. None
See application file for complete search history.

(56) References Cited

U.S. PATENT DOCUMENTS 3,927,943 A  12/1975  Pohl et al.
(Continued)

FOREIGN PATENT DOCUMENTS

CN  1591108 A  3/2005
(Continued)

OTHER PUBLICATIONS

Japanese Office action dated Jul. 13, 2010, for corresponding Japanese Patent application 2006-234478.

(Continued)

*Primary Examiner* — Matthew Luu
*Assistant Examiner* — Kendrick Liu
(74) *Attorney, Agent, or Firm* — Christie, Parker & Hale, LLP

(57) ABSTRACT

A laser induced thermal imaging apparatus for imaging an imaging layer of a donor film on an acceptor substrate. The laser induced thermal imaging apparatus includes: a substrate stage having an electromagnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be located between the substrate stage and the laser oscillator and including an opening portion of a pattern corresponding to a part to be imaged of the donor film and a permanent magnet for forming a magnetic force with the substrate stage; and a contact frame moving mechanism for moving the contact frame toward the substrate stage.

19 Claims, 4 Drawing Sheets

U.S. PATENT DOCUMENTS

| | | | |
|---|---|---|---|
| 4,377,339 A | | 3/1983 | Coppock |
| 4,500,803 A | | 2/1985 | Hayes |
| 4,975,637 A | | 12/1990 | Frankeny et al. |
| 5,182,003 A | | 1/1993 | Maass et al. |
| 5,248,990 A | * | 9/1993 | Ishikawa et al. .............. 347/262 |
| 5,725,979 A | | 3/1998 | Julich |
| 5,937,272 A | | 8/1999 | Tang |
| 6,057,067 A | | 5/2000 | Isberg et al. |
| 6,270,934 B1 | | 8/2001 | Chang et al. |
| 6,509,142 B2 | | 1/2003 | Baxter et al. |
| 6,649,286 B2 | | 11/2003 | Kim et al. |
| 6,666,541 B2 | | 12/2003 | Ellson et al. |
| 6,688,365 B2 | | 2/2004 | Tyan et al. |
| 6,695,029 B2 | | 2/2004 | Phillips et al. |
| 6,911,667 B2 | | 6/2005 | Pichler et al. |
| 6,939,649 B2 | | 9/2005 | Hotta et al. |
| 7,217,334 B2 | | 5/2007 | Toyoda |
| 7,233,101 B2 | | 6/2007 | Jin |
| 7,396,631 B2 | | 7/2008 | Wright et al. |
| 7,502,043 B2 | | 3/2009 | Noh et al. |
| 2002/0030440 A1 | | 3/2002 | Yamazaki |
| 2003/0042849 A1 | | 3/2003 | Ogino |
| 2003/0207500 A1 | * | 11/2003 | Pichler et al. ................. 438/127 |
| 2005/0007442 A1 | | 1/2005 | Kay et al. |
| 2005/0048295 A1 | | 3/2005 | Kim et al. |
| 2005/0087289 A1 | * | 4/2005 | Toyoda ......................... 156/230 |
| 2005/0133802 A1 | | 6/2005 | Lee et al. |
| 2005/0153472 A1 | | 7/2005 | Yotsuya |
| 2005/0181587 A1 | | 8/2005 | Duan et al. |
| 2006/0011136 A1 | | 1/2006 | Yamazaki et al. |
| 2006/0063096 A1 | | 3/2006 | Lee et al. |
| 2007/0006807 A1 | | 1/2007 | Manz |
| 2007/0009671 A1 | | 1/2007 | Manz |
| 2007/0046770 A1 | | 3/2007 | Noh et al. |

FOREIGN PATENT DOCUMENTS

| | | |
|---|---|---|
| CN | 1636760 A | 7/2005 |
| CN | 1638543 A | 7/2005 |
| EP | 0 749 847 A1 | 12/1996 |
| EP | 0 790 138 A1 | 8/1997 |
| EP | 1 538 004 A1 | 6/2005 |
| JP | 61-273968 A | 12/1986 |
| JP | 05-138959 | 6/1993 |
| JP | 08-123000 | 5/1996 |
| JP | 09-155720 | 6/1997 |
| JP | 09-167684 | 6/1997 |
| JP | 10-039791 | 2/1998 |
| JP | 10-41069 | 2/1998 |
| JP | 10-055888 | 2/1998 |
| JP | 11-054275 | 2/1999 |
| JP | 11-158605 | 6/1999 |
| JP | 2000-096211 | 4/2000 |
| JP | 2002-075636 | 3/2002 |
| JP | 2002-198174 | 7/2002 |
| JP | 2002-260921 | 9/2002 |
| JP | 2003-076297 | 3/2003 |
| JP | 2003-077658 | 3/2003 |
| JP | 2003-187972 | 7/2003 |
| JP | 2003-187973 | 7/2003 |
| JP | 2003-197372 | 7/2003 |
| JP | 2004-079540 | 3/2004 |
| JP | 2004-087143 | 3/2004 |
| JP | 2004-296224 | 10/2004 |
| JP | 2004-355949 | 12/2004 |
| JP | 2005-005245 | 1/2005 |
| JP | 2005-058911 | 3/2005 |
| JP | 2005-062356 | 3/2005 |
| JP | 2005-081299 | 3/2005 |
| JP | 2005-085799 | 3/2005 |
| JP | 2005-183381 | 7/2005 |
| TW | 369483 | 9/1999 |
| TW | 418336 | 1/2001 |

OTHER PUBLICATIONS

Japanese Office action dated Jun. 2, 2009, for corresponding Japanese application 2006-234478.

Taiwan Office action dated Jul. 28, 2009, for corresponding Taiwan application 095131945.

SIPO Office action dated May 9, 2008, with English translation, for Chinese Patent application 200610142214.8.

SIPO Office action dated Nov. 7, 2008, with English translation of text, for Chinese Patent application 200610136937.6.

Japanese Office action dated Mar. 24, 2009, for Japanese Patent application 2006-061367.

Japanese Office action dated May 12, 2009, for Japanese Patent application 2006-080211.

Japanese Office action dated Aug. 25, 2009, for Japanese Patent application 2006-061329.

Taiwanese Office action dated Jul. 28, 2008, for Taiwanese Patent application 095131694.

U.S. Office action dated Sep. 19, 2008, for related U.S. Appl. No. 11/508,159 (now issued as U.S. Patent 7,502,043).

Sep. 29, 2008 response to U.S. Office action dated Sep. 29, 2008, for related U.S. Appl. No. 11/508,159 (now issued as U.S. Patent 7,502,043).

U.S. Office action dated Aug. 20, 2008, for related U.S. Appl. No. 11/509,463.

U.S. Office action dated Feb. 23, 2009, for related U.S. Appl. No. 11/509,463.

U.S. Office action dated May 18, 2009, for related U.S. Appl. No. 11/507,792.

U.S. Office action dated May 21, 2009, for related U.S. Appl. No. 11/509,463.

U.S. Office action dated Jun. 18, 2009, for related U.S. Appl. No. 11/510,372.

U.S. Office action dated Mar. 8, 2010, for related U.S. Appl. No. 11/507,792.

Lee, Seong Taek et al., 21.3: *A New Patterning Method for Full-Color Polymer Light-Emitting Devices: Laser Induced Thermal Imaging (LITI)*; SID 02 Digest, 4pp.

Lee, Seong Taek et al., 29.3: *A Novel Patterning Method for Full-Color Organic Light-Emitting Devices: Laser Induced Thermal Imaging (LITI)*; SID 00 Digest, 4pp.

Niko et al., "*White light and RGB electroluminescence by light color-conversion*", 1998, Materials Physics and Devices for Molecular Electronics and Photonics, vol. 9, (1998) pp. 188-191.

Taiwan Office action dated Mar. 29, 2010 for Taiwanese application 095138004, with English translation.

Japanese Office action dated May 31, 2011, for corresponding Japanese Patent application 2006-061367, noting listed references in this IDS, 3 pages.

U.S. Office action dated Feb. 8, 2008, for cross-reference U.S. Appl. No. 11/512,991, 13 pages.

U.S. Office action dated Nov. 28, 2008, for cross-reference U.S. Appl. No. 11/512,991, 18 pages.

U.S. Office action dated Feb. 13, 2008, for cross-reference U.S. Appl. No. 11/509,463, 14 pages.

U.S. Office action dated Dec. 7, 2010, for cross-reference U.S. Appl. No. 11/512,570, 20 pages.

* cited by examiner

LASER INDUCED THERMAL IMAGING APPARATUS AND LASER INDUCED THERMAL IMAGING METHOD

CROSS-REFERENCE TO RELATED APPLICATIONS

This application is a divisional of U.S. patent application Ser. No. 11/512,991, filed Aug. 28, 2006 which claims the benefit of and priority to Korean Patent Application No. 10-2005-0109825 filed on Nov. 16, 2005, and Korean Patent Application No. 10-2005-0105695 filed on Nov. 4, 2005, in the Korean Intellectual Property Office, the entire contents of all of which are incorporated herein by reference.

BACKGROUND

1. Field of the Invention

The present invention relates to a laser induced thermal imaging apparatus and laser induced thermal imaging method, and more particularly, to a laser induced thermal imaging apparatus and laser induced thermal imaging method for performing a process of laminating a donor film and an acceptor substrate by using magnetic force.

2. Discussion of Related Art

An organic light emitting device is a device that has a light emitting layer located between a first electrode and a second electrode. The organic light emitting device emits light by combining holes and electrons at the light emitting layer when a voltage is applied between the electrodes. Hereinafter, the prior art and the present invention will be described in reference to the laser induced thermal imaging apparatus used for fabricating an organic light emitting device, however, the present invention is not limited thereto.

The laser induced thermal imaging method irradiates a laser on a donor substrate including a base substrate, a light-to-heat conversion layer and a transfer layer (or imaging layer), and converts the laser passing through the base substrate into heat in the light-to-heat conversion layer, so that the light-to-heat conversion layer is deformed and expanded to deform and expand the neighboring transfer layer. This way, the transfer layer is adhered to the acceptor substrate, such that the transfer layer can be transferred to the acceptor substrate.

When performing the laser induced thermal imaging method, the inside of a chamber in which the imaging is done should be in a vacuum state, in order to comply with a deposition process when forming the light emitting device. However, when performing the laser induced thermal imaging in the vacuum state according to the prior art, there has been a problem that the imaging from the imaging layer is not carried out well due to a foreign substance (or impurities) or a space (void or gap) generated between the donor substrate and the acceptor substrate. Therefore, in the laser induced thermal imaging method, a method for laminating the donor substrate and the acceptor substrate is important, and various schemes for solving the problem with the space or impurities have been contemplated.

FIG. 1 is a partial cross sectional view of a laser induced thermal imaging apparatus according to the prior art for overcoming the above problems. According to FIG. 1, a laser induced thermal imaging apparatus 10 includes a substrate stage 12 positioned inside a chamber 11 and a laser oscillator 13 positioned at an upper part of the chamber 11.

The substrate stage 12 is a stage for placing an acceptor substrate 14 and a donor film 15, which are introduced into the chamber 11.

In this case, in order to laminate an acceptor substrate 14 and the donor film 15 without generating the foreign substance or the space between the acceptor substrate 14 and the donor film 15, the inside of the chamber 11 in which the laser induced thermal imaging is performed, is not to be maintained in the vacuum state but to be sucked by a vacuum pump P by connecting a hose 16 to the lower part of the substrate stage 12, adhering the acceptor substrate 14 and the donor film 15. However, in such a prior art, since the generation of the foreign substance 1 and the void between the acceptor substrate 14 and the donor film 15 cannot be completely prevented and furthermore, the vacuum state inside the chamber 11 cannot be maintained, it has been known to have an adverse effect on reliability and duration of a product.

SUMMARY OF THE INVENTION

It is an aspect of the present invention to provide a laser induced thermal imaging apparatus and a laser induced thermal imaging method, for laminating an acceptor substrate and a donor film in a vacuum condition by using a magnetic force.

In an exemplary embodiment according to the present invention, there is provided a laser induced thermal imaging apparatus for forming a light emitting layer of an organic light emitting device. The apparatus includes: a substrate stage including an electromagnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including an opening portion of a pattern corresponding to a part to be imaged of the donor film and a permanent magnet for forming a magnetic force with the substrate stage; and a contact frame moving mechanism for moving the contact frame toward the substrate stage.

In another exemplary embodiment according to the present invention, there is provided a laser induced thermal imaging apparatus for forming a light emitting layer of an organic light emitting device. The apparatus includes: a substrate stage including a permanent magnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including an opening portion of a pattern corresponding to a part to be imaged of the donor film and a permanent magnet for forming a magnetic force with the substrate stage; and a contact frame moving mechanism for moving the contact frame toward the substrate stage.

In another exemplary embodiment according to the present invention, there is provided a laser induced thermal imaging apparatus for forming a light emitting layer of an organic light emitting device. The apparatus includes: a substrate stage including a permanent magnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including an opening portion of a pattern corresponding to a part to be imaged of the donor film and an electromagnet for forming a magnetic force with the substrate stage; and a contact frame moving mechanism for moving the contact frame toward the substrate stage.

In another exemplary embodiment according to the present invention, there is provided a laser induced thermal imaging apparatus for forming a light emitting layer of an organic light emitting device. The apparatus includes: a substrate stage including a magnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including at least one transmitting portion of transparent material for a laser to pass through, and a magnet for forming a magnetic force with the substrate stage; and a contact frame moving mechanism for moving the contact frame toward the substrate stage.

In another exemplary embodiment according to the present invention, there is provided a laser induced thermal imaging apparatus for forming a light emitting layer of an organic light emitting device. The apparatus includes: a substrate stage including magnetic substance, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including at least one transmitting portion of transparent material for allowing a laser to pass through, and a magnet for forming a magnetic force with the substrate stage; and a contact frame moving mechanism for moving the contact frame toward the substrate stage.

In another exemplary embodiment according to the present invention, there is provided a laser induced thermal imaging apparatus for forming a light emitting layer of an organic light emitting device. The apparatus includes: a substrate stage including a magnet, and adapted to receive an acceptor substrate having a pixel area of the organic light emitting device and a donor film including the organic light emitting layer to be imaged on the pixel area; a laser oscillator for irradiating a laser on the donor film; a contact frame adapted to be placed between the substrate stage and the laser oscillator and including at least one transmitting portion of transparent material for allowing a laser to pass through, and magnetic substance for forming a magnetic force with the substrate stage; and a contact frame moving mechanism for moving the contact frame toward the substrate stage.

In another exemplary embodiment according to the present invention, there is provided a laser induced thermal imaging method for forming a light emitting layer of an organic light emitting device. The method includes: placing an acceptor substrate having a pixel area of the organic light emitting device and a donor film including the organic light emitting layer to be imaged on the pixel area between a contact frame including an electromagnet and a substrate stage including a permanent magnet; adhering the acceptor substrate and the donor film using a magnetic force formed between the contact frame and the substrate stage; and imaging the organic light emitting layer of the donor film on the acceptor substrate by irradiating a laser on the donor film corresponding to the organic light emitting layer.

In another exemplary embodiment according to the present invention, there is provided a laser induced thermal imaging method for forming a light emitting layer of an organic light emitting device. The method includes: placing an acceptor substrate having a pixel area of the organic light emitting device and a donor film including the organic light emitting layer to be imaged on the pixel area between a contact frame including a permanent magnet and a substrate stage including a permanent magnet; adhering the acceptor substrate and the donor film using a magnetic force formed between the contact frame and the substrate stage; and imaging the organic light emitting layer of the donor film on the acceptor substrate by irradiating a laser on the donor film corresponding to the organic light emitting layer.

In another exemplary embodiment according to the present invention, there is provided a laser induced thermal imaging method for forming a light emitting layer of an organic light emitting device. The method includes: placing an acceptor substrate having a pixel area of the organic light emitting device and a donor film including the organic light emitting layer to be imaged on the pixel area between a contact frame including a permanent magnet and a substrate stage including an electromagnet; adhering the acceptor substrate and the donor film using a magnetic force formed between the contact frame and the substrate stage; and imaging the organic light emitting layer of the donor film on the acceptor substrate by irradiating a laser on the donor film corresponding to the organic light emitting layer.

BRIEF DESCRIPTION OF THE DRAWINGS

These and/or other aspects and features of the invention will become apparent and more readily appreciated from the following description of exemplary embodiments, taken in conjunction with the accompanying drawings of which.

DETAILED DESCRIPTION

Figure 1:
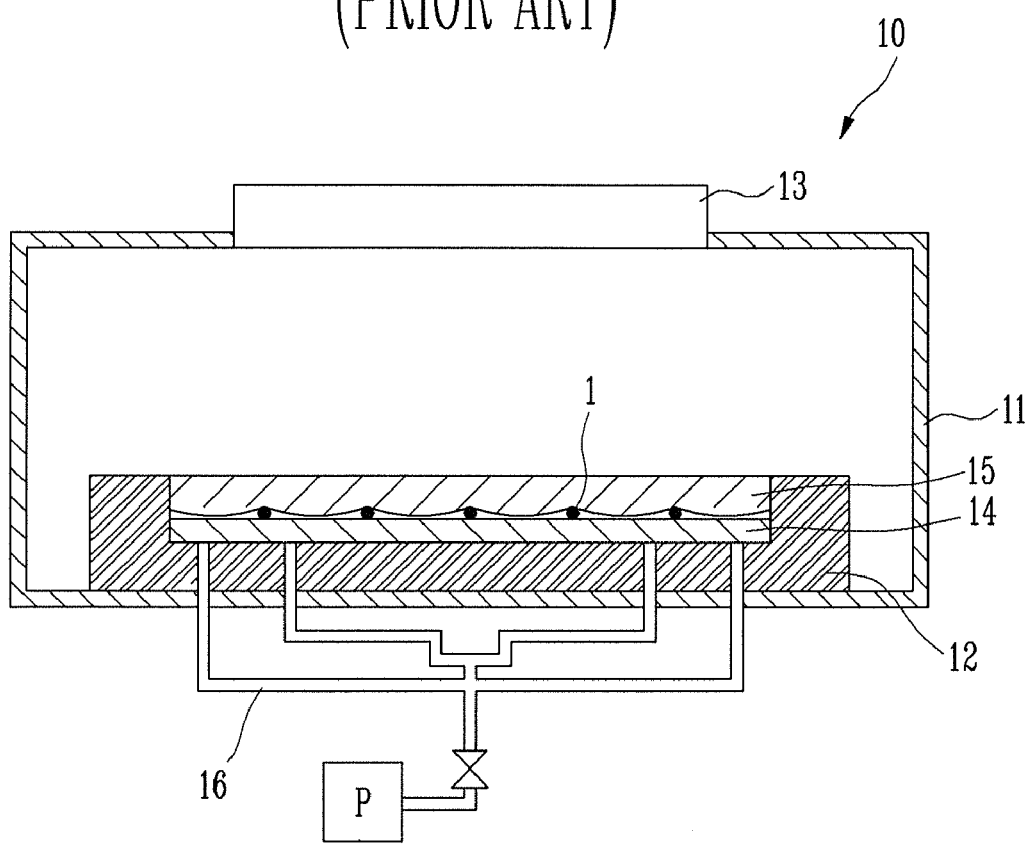
FIG. 1 is a partial cross sectional view showing a laser induced thermal imaging apparatus according to the prior art.
Figure 2:
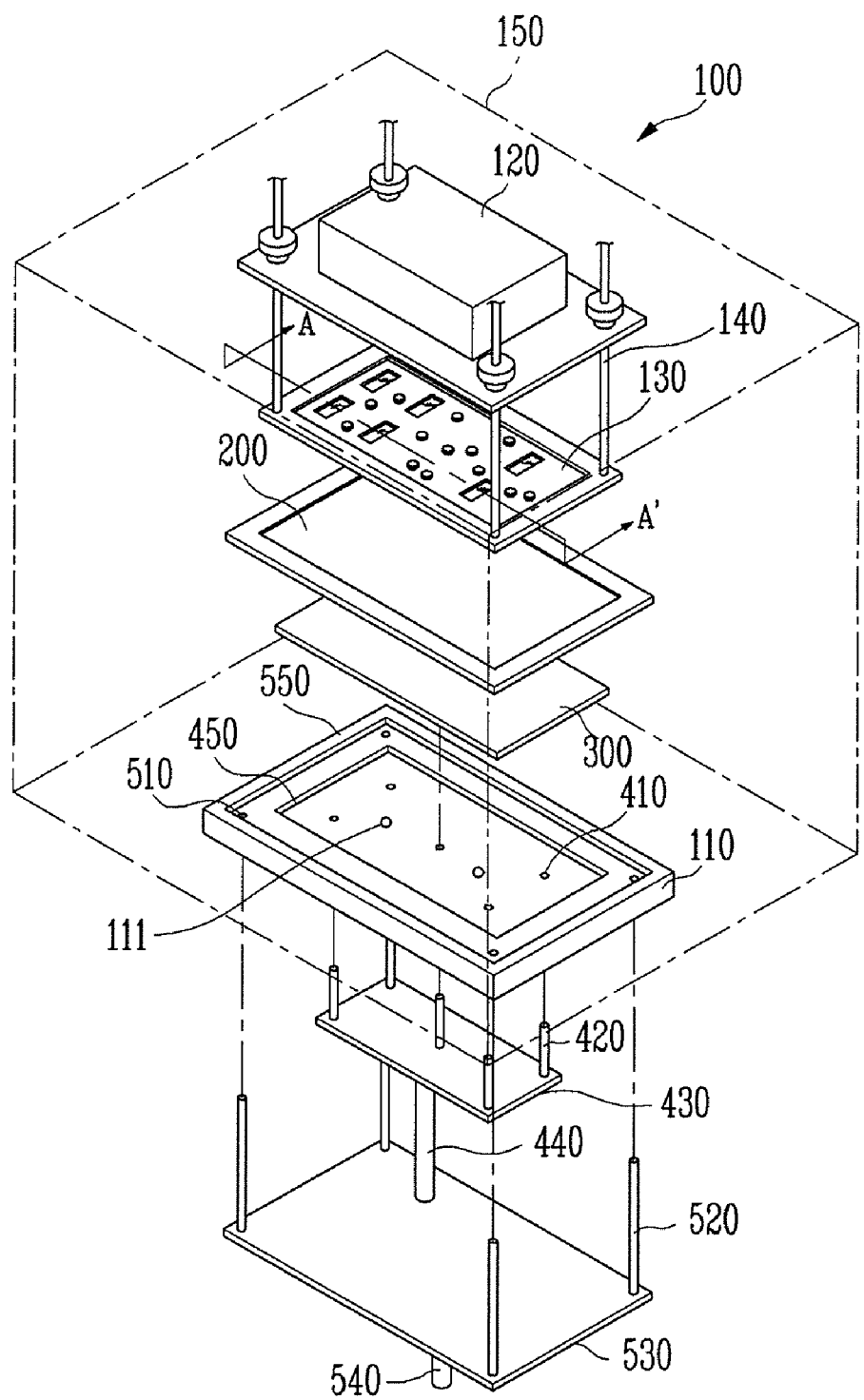
FIG. 2 is an exploded perspective view of a laser induced thermal imaging apparatus according to a first embodiment to a sixth embodiment of the present invention.

Hereinafter, certain exemplary embodiments of the present invention will be described in more detail with reference to the accompanying drawings. FIG. 2 is an exploded perspective view of a laser induced thermal imaging apparatus according to a first embodiment to a sixth embodiment of the present invention. According thereto, a laser induced thermal imaging apparatus 100 includes a substrate stage 110, a laser oscillator 120, a contact frame 130, a contact frame moving mechanism 140 and a chamber 150.

<First Embodiment>

The first embodiment according to the present invention represents a contact process (or adhering process) of a donor film 200 and an acceptor substrate 300 using a substrate stage 110 that includes an electromagnet and a contact frame 130 having a predetermined pattern of opening portions and permanent magnets. The opening portions on the contact frame 130 may be openings or may be transmitting portions covered with transparent material such as glass or transparent polymer. The substrate stage 110 includes one or more magnets 111, which may be permanent magnets, electromagnets, magnetic substance, or any other suitable material having magnetic properties.

The chamber 150 may be a chamber used in the conventional laser induced thermal imaging apparatus and the inside of the chamber 150 is mounted with at least the substrate stage 110 and adapted to receive the contact frame 130, etc. Inside the chamber 150, the donor film 200 and the acceptor substrate 300 can be transferred or placed, and for this, a transferring mechanism (not shown) for transferring the donor film 200 and the acceptor substrate 300 to the inside of the chamber 150 is provided outside the chamber 150. From the viewpoint of a manufacturing process, the inside of the chamber 150 should be maintained in a vacuum state, but the present invention is not limited thereto.

The substrate stage 110 is positioned at or near a bottom side of the chamber 150, and in the first embodiment, the substrate stage 110 is provided with at least one electromagnet (not shown in FIG. 2). In the described embodiment, an electromagnet is provided inside the substrate stage 110. Here, the electromagnet may be arranged in one plane. However, in cases where a number of electromagnets are used, the electromagnets may be formed in a concentric circular pattern or as multiple columns of length and width.

The substrate stage 110 may further include a driving mechanism (not shown) for moving the substrate stage. When the substrate stage 110 is moved, the laser oscillator 120 can be configured to irradiate a laser in only one direction. For example, when the laser is irradiated in a longitudinal direction and the substrate stage 110 further includes a driving mechanism for moving it in a transverse direction, the laser can be irradiated on an entire area of the donor film 200.

Also, the substrate stage 110 can include a mounting mechanism for receiving and mounting the acceptor substrate 300 and the donor film 200. The mounting mechanism allows the acceptor substrate 300 and the donor film 200, transferred to the inside of the chamber 150 using the transferring mechanism, to be mounted precisely at a desired position (e.g., a predetermined position).

In the present embodiment, the mounting mechanism can be configured to have through-holes 410, 510, guide bars 420, 520, moving plates 430, 530, supporters 440, 540, and mounting grooves 450, 550. Here, the guide bars 420, which provide a rising motion or a falling motion along with the moving plate 430 and the supporter 440, is in the structure that the guide bars 420 receive the acceptor substrate 300 while passing and rising through the through-holes 410, and allow the acceptor substrate 300 to safely arrive on the mounting groove 450 formed on the substrate stage 110 while passing and falling through the through-holes 410. The various modifications of the mounting mechanism can be implemented by a person having ordinary skill in the art and the detailed explanation thereof will thus be omitted.

Figure 3:
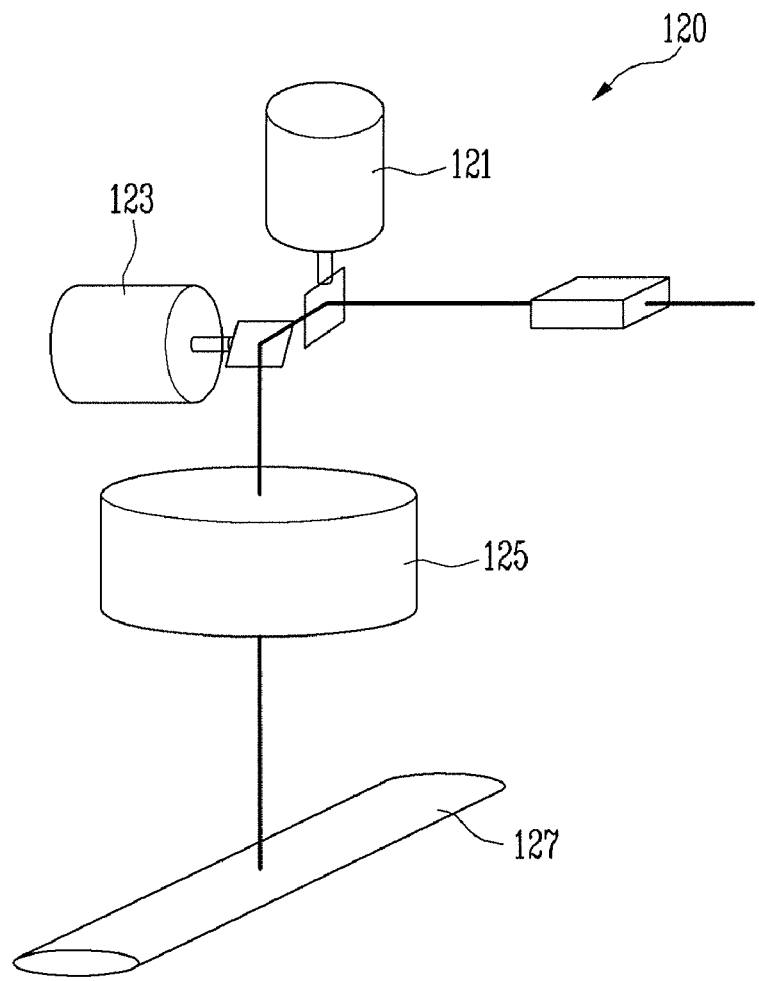
FIG. 3 is a construction view showing an embodiment of a laser oscillator of a laser induced thermal imaging apparatus used in the present invention.

The laser oscillator 120 can be installed outside or inside the chamber 150. In the described embodiment, the laser oscillator 120 is installed inside the chamber so that the laser can be irradiated from the upper part of the chamber 150. According to FIG. 3, which is a schematic construction view of the laser oscillator 120, in the present embodiment, the laser oscillator 120 uses CW ND:YAG laser (1604 mm) and includes two galvanometer scanners 121, 123, a scan lens 125 and a cylinder lens 127, but is not limited thereto.

Figure 4:
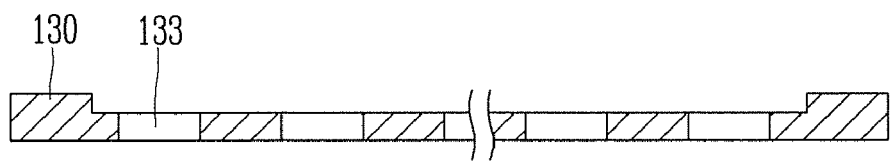
FIG. 4 is a schematic cross-sectional view of a contact frame of a laser induced thermal imaging apparatus taken along the line A-A' in FIG. 2.

FIG. 4 is a schematic cross-sectional view of the contact frame 130 of FIG. 2, taken along the line A-A'. The contact frame 130 includes one or more permanent magnets to form magnetic force with the electromagnet of the substrate stage, resulting in strongly laminating (or adhering to each other) the donor film 200 and the acceptor substrate 300 positioned between the substrate stage 110 and the contact frame 130. Here, the contact frame 130 itself may be formed as a permanent magnet, or one or more permanent magnets may be formed on an upper side or a lower side of the contact frame 130. In the described embodiment, the permanent magnet consists of permanent magnet nano particles. The contact frame 130 also includes opening portions (or openings) 133, which may be transmitting portions covered by transparent material (e.g., glass or transparent polymer) in other embodiments.

The contact frame 130 includes one or more opening portions through which a laser beam can pass. That is, the desired area of the donor film 200 can be imaged on (or transferred to) the acceptor substrate 300 using the opening portions of the pattern corresponding to the part of the donor film 200 to be imaged. Therefore, the contact frame 130 may concurrently perform a mask role for irradiating the laser only at one or more desired positions or locations (e.g., predetermined positions).

The contact frames 130 that can be exchanged or replaced with each other and operated, are formed with at least one opening portion corresponding to which each sub-pixel of the organic light emitting device is formed using the organic light emitting layer to be imaged.

Figure 5:
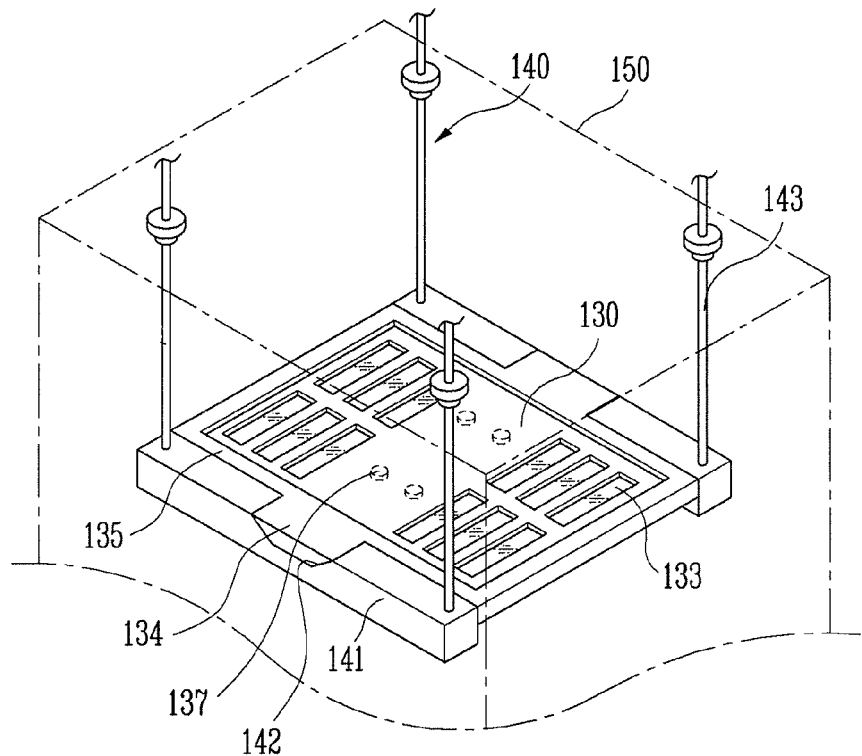
FIG. 5 is a perspective view showing a contact frame moving mechanism of a laser induced thermal imaging apparatus according to the present invention.

The contact frame moving mechanism 140, which is a mechanism for moving the contact frame 130 toward the substrate stage, can be variously manufactured, however, according to the embodiment shown in FIG. 5, it includes a cradle 141 including a cradling groove 142, connecting bars 143 connected to the cradle 141 on the upper side of the chamber 150 and a driving mechanism (not shown) for driving the connecting bars 143 and the cradle 141 connected thereto up and down. The contact frame 130 is mounted and moved on a tray 135 including a cradling projection 134 to move, when being moved by the moving mechanism as shown in FIG. 5. The contact frame 130 includes one or more magnets 137, which may be electromagnets, permanent magnets or magnetic substance.

An exchange mechanism such as a robot arm, etc., can be used to exchange the first contact frame and the second contact frame. For example, after forming a first sub-pixel and a second sub-pixel with a first contact frame placed on the cradle, the robot arm may transfer the first contact frame from the cradle to the outside and may position a second contact frame on the cradle so that they can be exchanged with each other.

Figure 6:
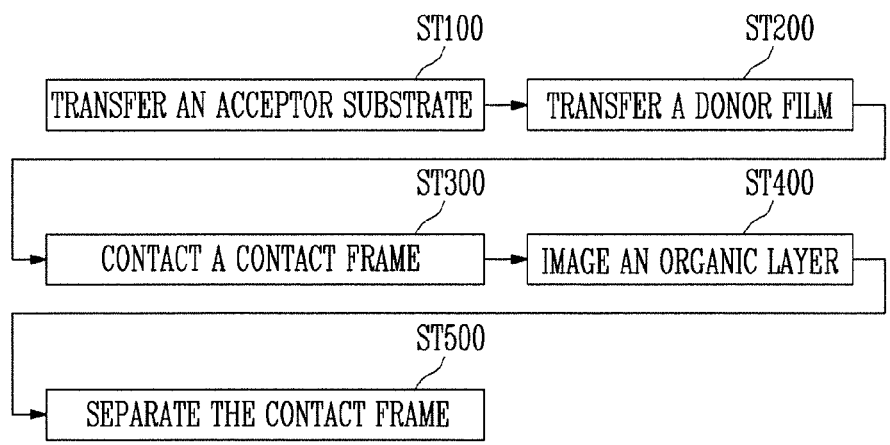
FIG. 6 is a flow diagram showing a laser induced thermal imaging method according to embodiments of the present invention.

Next, referring to FIG. 2 and FIG. 6, a method for forming the organic light emitting device using the foregoing laser induced thermal imaging apparatus will be described. In forming the organic light emitting device, the method for using the foregoing laser induced thermal imaging apparatus includes the steps of: transferring (or placing) the acceptor substrate ST100, transferring (or placing) the donor film ST200, contacting (or adhering) the contact frame ST300, imaging (or transferring) an organic layer corresponding to the sub-pixel ST400, and separating the contact frame ST500.

The step of transferring the acceptor substrate ST100 positions or places the acceptor substrate 300, on which the organic light emitting layer is to be formed, on the substrate stage 110 including a magnet or magnetic substance. The pixel area, on which the light emitting layer to be imaged from the donor film is to be formed, is defined on the acceptor substrate 300.

The step of transferring the donor film ST200 transfers or places the donor film including the light emitting layer to be imaged on (or transferred to) the acceptor substrate 300. At this time, the light emitting layer can be configured to have any one suitable color, for example, R.

The step of contacting (or adhering) the contact frame ST300 moves the contact frame toward the substrate stage by magnetic attractive force, wherein the contact frame includes the opening portions through which the laser to image the organic light emitting layer of the donor film passes, and the permanent magnet. Thereby, the donor film and the acceptor substrate positioned therebetween are laminated or closely contacted or adhered to each other. In the described embodiment, the contact frame primarily moves and contacts toward and/or with the acceptor substrate using the contact frame moving mechanism, and secondarily contacts with (or adheres to) it more strongly using magnetic attractive force.

The step of imaging the sub-pixel ST400 expands the organic light emitting layer provided in the donor film by irradiating the laser on the donor film through the opening portions of the contact frame and images (or transfers) it to the pixel area of the acceptor substrate. At this time, the irradiating range of the laser is controlled so that the laser can be irradiated only on the pixel area corresponding to the opening portions.

The step of separating the contact frame ST500 separates the contact frame from the acceptor substrate by using the contact frame moving mechanism, wherein in the described embodiment, they are primarily separated by magnetic repulsive force and the contact frame secondarily rises to the upper part of the chamber by the contact frame moving mechanism.

Although the present invention has been mainly explained in reference to the first embodiment, various modifications and changes can be made without departing from the spirit or the scope of the invention. For example, the changes in the constitution of the contact frame moving mechanism, the shape of the transmitting portions, the shape of the opening portions, the shape of the magnet to be included (use of magnetic nano particles, etc.), etc., can be derived by a person having ordinary skill in the art based on the disclosure in this application. Hereinafter, second through sixth embodiments will describe the construction identical with that of the first embodiment with reference to FIG. 2, however, represents the range to which the substrate stage and the contact frame are differently applicable, respectively. Therefore, since the description of the first embodiment can be applied to the descriptions about the remaining components and process methods other than the substrate stage and the contact frame, the descriptions thereof will be omitted.

<Second Embodiment>

The second embodiment according to the present invention represents a contacting (or adhering) process of a donor film 200 and an acceptor substrate 300 using a substrate stage including one or more permanent magnets and a contact frame including a pattern (e.g., a predetermined pattern) of opening portions and one or more permanent magnets.

Referring back to FIG. 2, the substrate stage 110 is positioned at or near a bottom side of the chamber 150, and in the second embodiment, the substrate stage 110 is provided with at least one permanent magnet. In the described embodiment, a permanent magnet is provided inside the substrate stage 110.

The contact frame 130 includes one or more permanent magnets to form magnetic force with the one or more electromagnets of the substrate stage, resulting in strongly laminating the donor film 200 and the acceptor substrate 300 positioned between the substrate stage 110 and the contact frame 130. In the described embodiment, the contact frame 130 itself may be formed as a permanent magnet, or the permanent magnets may be formed on the upper side or the lower side of the contact frame 130. In the described embodiment, the permanent magnet consists of (or includes) permanent magnet nano particles.

The contact frame 130 includes opening portions (or transmitting portions) 133 (shown in FIG. 5) through which the laser is able to pass. That is, the desired area of the donor film 200 can be imaged on (or transferred to) the acceptor substrate 300 through the opening portions of the pattern corresponding to the part of the donor film 200 to be imaged (or transferred). Therefore, the contact frame 130 may concurrently perform a mask role for irradiating the laser only at a desired position (e.g., a predetermined position).

The contact frames 130 that can be exchanged or replaced with each other, are formed with at least one opening portion corresponding to which each sub-pixel of the organic light emitting device is formed using the organic light emitting layer to be imaged (or transferred).

<Third Embodiment>

The third embodiment according to the present invention represents a contacting process of a donor film 200 and an acceptor substrate 300 using a substrate stage including one or more permanent magnets and a contact frame including a predetermined pattern of opening portions and one or more electromagnets.

The substrate stage 110 is positioned at or near a bottom side of a chamber 150, and in the third embodiment, the substrate stage 110 is provided with at least one permanent magnet. In the described embodiment, a permanent magnet is provided inside the substrate stage 110. In the described embodiment, the permanent magnet may consist of (or include) permanent magnet nano particles.

In the described embodiment, the contact frame 130 includes one or more electromagnets to form a magnetic force with one or more permanent magnets of the substrate stage 110, resulting in strongly laminating the donor film 200 and the acceptor substrate 300 positioned between the substrate stage 110 and the contact frame 130. Here, the electromagnets may be arranged in one plane, however in case where a number of electromagnets are used; the electromagnets may be formed in a concentric circular or as multiple columns of length and width.

The contact frame 130 includes opening portions 133 through which the laser is able to pass. That is, the desired area of the donor film 200 can be imaged on (or transferred to) the acceptor substrate 300 through the opening portions of the pattern corresponding to the part of the donor film 200 to be imaged. Therefore, the contact frame 130 may concurrently perform a mask role for irradiating the laser only on desired positions (e.g., predetermined positions).

The contact frames 130 that can be exchanged or replaced with each other, are formed with at least one opening portion corresponding to which each sub-pixel of the organic light emitting device is formed using the organic light emitting layer to be imaged.

<Fourth Embodiment>

The fourth embodiment according to the present invention represents a contacting process of a donor film 200 and an acceptor substrate 300 using a substrate stage including one or more magnets and a contact frame including transmitting portions made of transparent material and one or more magnets.

The substrate stage 110 is positioned at or near a bottom side of a chamber 150, and in the fourth embodiment, the substrate stage 110 is provided with at least one magnet. In the described embodiment, one or more magnets are provided inside the substrate stage 110.

The contact frame 130 includes one or more magnets to form a magnetic force with the one or more magnets of the substrate stage 110, resulting in strongly laminating (or closely adhering to each other) the donor film 200 and the acceptor substrate 300 positioned between the substrate stage 110 and the contact frame 130. Here, the substrate stage 110 and the contact frame 130 may be formed as (or include) an electromagnet and a permanent magnet, respectively; the substrate stage 110 and the contact frame 130 may be formed as (or include) a permanent magnet and an electromagnet, respectively; and both the substrate stage 110 and the contact frame 130 may be formed as (or include) the electromagnet or the permanent magnet. In the described embodiment, the permanent magnet consists of (or includes) permanent magnet nano particles.

The contact frame 130 includes transmitting portions 133 capable of allowing the laser to pass through. FIG. 4 is a schematic cross-sectional view taken along the line A-A' in FIG. 2 showing the construction of the transmitting portions 133. Due to the transmitting portions 133, the contact frame 130 may concurrently perform a mask role for irradiating the laser only on desired positions (e.g., predetermined positions). There is no restriction on the transparent materials of the transmitting portions 133. In the described embodiment, glass or transparent polymer is used as the material for the transmitting portions. Also, since the transmitting portions 133 cannot be magnetic in the described embodiment, the transmitting portions 133 are to be maintained at a proper level such that the magnetic force of the contact frame 130 laminates the donor film and the acceptor substrate together. Therefore, in the described embodiment, the total area of the transmitting portions 133 is restricted to 1% to 50% of the entire area of the contact frame 130.

The contact frames 130 that can be exchanged or replaced with each other, are formed with at least one opening portion (transmitting portion) in which each sub-pixel of the organic light emitting device is formed using the organic light emitting layer to be imaged.

<Fifth Embodiment>

The fifth embodiment according to the present invention represents a contacting process of a donor film 200 and an acceptor substrate 300 using a substrate stage 110 including magnetic substance and a contact frame 130 including transmitting portions 133 of transparent material and at least one magnet.

The substrate stage 110 is positioned at or near a bottom side of a chamber 150, and in the fifth embodiment, the substrate stage 110 is provided with at least one magnetic substance. In the described embodiment, the magnetic substance may be a ferromagnetic substance or a weakly magnetic substance, and may include one selected from the group consisting of Fe, Ni, Cr, $Fe_2O_3$, $Fe_3O_4$, $CoFe_2O_4$ and a combination thereof.

The contact frame 130 includes a magnet to form magnetic force with the magnetic substance of the substrate stage 110, resulting in strongly laminating (or adhering closely together) the donor film 200 and the acceptor substrate 300 positioned between the substrate stage 110 and the contact frame 130. Here, the substrate stage 110 and the contact frame 130 can be formed as magnetic substance and a permanent magnet, respectively; and the substrate stage 110 and the contact frame 130 can be formed as the magnetic substance and an electromagnet, respectively.

The contact frame 130 includes transmitting portions 133 capable of allowing the laser to pass through. FIG. 4 is a schematic cross-sectional view taken along the line A-A' in FIG. 2 showing the construction of the transmitting portions 133. Due to the transmitting portions 133, the contact frame 130 may concurrently perform a mask role for irradiating the laser only on desired positions (e.g., predetermined positions) of the donor film 200. There is no restriction on the transparent materials of the transmitting portion 133. In the exemplary embodiment, glass or polymer may be used as the transparent material. Also, since the transmitting portions 133 typically are not magnetic, an area occupied by the transmitting portion 133 should be maintained at a proper level such that sufficient magnetic force of the contact frame 130 that laminates the donor film and the acceptor substrate is provided. By way of example, the area of the transmitting portions 133 is limited to 1% to 50% of the entire area of the contact frame 130 in one embodiment.

The contact frames 130 that can be exchanged or replaced with each other, are formed with at least one opening portion (i.e., transmitting portion) through which each sub-pixel of the organic light emitting device is formed using the organic light emitting layer to be imaged.

<Sixth Embodiment>

The sixth embodiment according to the present invention represents a contacting (or adhering) process of a donor film 200 and an acceptor substrate 300 using a substrate stage 110 including one or more magnets and a contact frame 130 including a transmitting portion 133 of transparent material and magnetic substance.

Referring back to FIG. 2, the substrate stage 110 is positioned at or near a bottom side of the chamber 150, and in the sixth embodiment, the substrate stage 110 is provided with at least one magnet. In the described embodiment, the magnet may be electromagnets or permanent magnets, and when the magnet is a permanent magnet, it may consist of permanent magnet nano particles.

The contact frame 130 includes magnetic substance to form a magnetic force with the magnet of the substrate stage 110, thereby resulting in strongly laminating (or adhering close to each other) the donor film 200 and the acceptor substrate 300 positioned between the substrate stage 110 and the contact frame 130. The magnetic substance may include a ferromagnetic substance or a weakly magnetic substance, and may include one selected from the group consisting of Fe, Ni, Cr, $Fe_2O_3$, $Fe_3O_4$, $CoFe_2O_4$ and a combination thereof. The substrate stage 110 and the contact frame 130 may be formed as (or include) one or more permanent magnets and magnetic substance, respectively; or the substrate stage 110 and the contact frame 130 may be formed as (or include) one or more electromagnets and magnetic substance, respectively.

The contact frame 130 includes transmitting portions 133 capable of allowing the laser to pass through. FIG. 4 is a schematic cross-sectional view taken along the line A-A' in FIG. 2 showing the construction of the transmitting portions 133. Due to the transmitting portions 133, the contact frame 130 may concurrently perform a mask role for irradiating the laser only on desired positions (e.g., predetermined positions). There is no restriction on the transparent materials of the transmitting portions 133. In one embodiment, glass or polymer may be used as the transparent material. Also, since the transmitting portions 133 typically are not magnetic, the total area of the transmitting portions 133 should be maintained at a proper level such that sufficient magnetic force of the contact frame 130 is provided to laminate the donor film and the acceptor substrate. This is achieved, for example, by restricting the total area of the transmitting portions 133 to 1% to 50% of the entire area of the contact frame 130.

The contact frames 130 that can be exchanged or replaced with each other, are formed with at least one opening portion (i.e., transmitting portion) in which each sub-pixel of the organic light emitting device is formed using the organic light emitting layer to be imaged.

The laser induced thermal imaging apparatus and laser induced thermal imaging method according to the present invention, is suitable for laminating the donor substrate and the acceptor substrate by using magnetic force under vacuum, thereby, being able to equally maintain the vacuum state as in the prior process of the organic light emitting device as well as can laminate the donor substrate and the acceptor substrate without generating a foreign substance or an empty void (or space) therebetween, thereby, making the imaging of the light emitting layer of the organic light emitting device more efficiently.

Although certain exemplary embodiments of the present invention have been shown and described, it would be appreciated by those skilled in the art that changes might be made in this embodiment without departing from the principles and spirit of the invention, the scope of which is defined in the accompanying claims and their equivalents.

What is claimed is:

1. A laser induced thermal imaging apparatus for forming a light emitting layer of an organic light emitting device, the apparatus comprising:
    a substrate stage comprising a magnet, the substrate stage being adapted to receive an acceptor substrate having a pixel area of the organic light emitting device and a donor film comprising the organic light emitting layer to be imaged on the pixel area;
    a laser oscillator for irradiating a laser on the donor film;
    a contact frame adapted to be placed between the substrate stage and the laser oscillator and comprising at least one transmitting portion of transparent material for allowing a laser to pass through, and a magnet for forming magnetic force with the substrate stage; and
    a contact frame moving mechanism for moving the contact frame toward the substrate stage.

2. The laser induced thermal imaging apparatus according to claim 1, further comprising a vacuum chamber having the substrate stage located therein, and adapted to receive the contact frame.

3. The laser induced thermal imaging apparatus according to claim 1, wherein an entire area of the at least one transmitting portion of the contact frame is 1% to 50% of an area of the contact frame.

4. The laser induced thermal imaging apparatus according to claim 1, wherein the transparent material comprises a glass or a transparent polymer.

5. The laser induced thermal imaging apparatus according to claim 1, wherein the magnet of the contact frame comprises an electromagnet or a permanent magnet.

6. The laser induced thermal imaging apparatus according to claim 5, wherein the magnet of the contact frame comprises an electromagnet.

7. The laser induced thermal imaging apparatus according to claim 1, wherein the magnet of the substrate stage is an electromagnet or a permanent magnet.

8. The laser induced thermal imaging apparatus of claim 1, wherein the magnet of the substrate stage comprises magnetic substance.

9. The laser induced thermal imaging apparatus according to claim 8, wherein the magnetic substance is one selected from the group consisting of Fe, Ni, Cr, $Fe_2O_3$, $Fe_3O_4$, $CoFe_2O_4$ and a combination thereof.

10. The laser induced thermal imaging apparatus according to claim 1, wherein the magnet of the contact frame comprises magnetic substance.

11. The laser induced thermal imaging apparatus according to claim 10, wherein the magnetic substance is one selected from the group consisting of Fe, Ni, Cr, $Fe_2O_3$, $Fe_3O_4$, $CoFe_2O_4$ and a combination thereof.

12. The laser induced thermal imaging apparatus according to claim 1, wherein the substrate stage and the contact frame are configured to adhere the donor film and the acceptor substrate to each other utilizing the magnetic force formed between the magnet of the substrate stage and the magnet of the contact frame.

13. The laser induced thermal imaging apparatus according to claim 1, wherein the magnet of the contact frame comprises a plurality of permanent magnets or electromagnets spaced apart from each other.

14. The laser induced thermal imaging apparatus according to claim 13, wherein the magnet of the contact frame comprises a plurality of electromagnets spaced apart from each other.

15. A laser induced thermal imaging method for forming a light emitting layer of an organic light emitting device, the method comprising:
    placing an acceptor substrate having a pixel area of the organic light emitting device and a donor film comprising the organic light emitting layer to be imaged on the pixel area, between a contact frame comprising a magnet and a substrate stage comprising a magnet;
    adhering the acceptor substrate and the donor film to each other using a magnetic force formed between the magnet of the contact frame and the magnet of the substrate stage; and
    imaging the organic light emitting layer of the donor film on the acceptor substrate by irradiating a laser on the donor film corresponding to the organic light emitting layer.

16. The laser induced thermal imaging method according to claim 15, wherein the magnet of the contact frame comprises an electromagnet and the magnet of the substrate stage comprises a permanent magnet.

17. The laser induced thermal imaging method according to claim 15, wherein the magnet of the contact frame comprises a permanent magnet and the magnet of the substrate stage comprises a permanent magnet.

18. The laser induced thermal imaging method according to claim 15, wherein the magnet of the contact frame comprises a permanent magnet and the magnet of the substrate stage comprises an electromagnet.

19. The laser induced thermal imaging method according to claim 15, wherein at least one of the magnets comprises magnetic substance.

* * * * *